United States Patent
Zheng

(10) Patent No.: US 12,125,887 B2
(45) Date of Patent: Oct. 22, 2024

(54) MOUNTING APPARATUS AND MOUNTING METHOD

(71) Applicant: CHANGXIN MEMORY TECHNOLOGIES, INC., Hefei (CN)

(72) Inventor: Fencheng Zheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 408 days.

(21) Appl. No.: 17/455,998

(22) Filed: Nov. 22, 2021

(65) Prior Publication Data

US 2023/0014491 A1  Jan. 19, 2023

Related U.S. Application Data

(63) Continuation of application No. PCT/CN2021/110056, filed on Aug. 2, 2021.

(30) Foreign Application Priority Data

Jul. 16, 2021  (CN) .......................... 202110806169.6

(51) Int. Cl.
*H01L 21/67* (2006.01)
*H01L 29/40* (2006.01)

(52) U.S. Cl.
CPC ...... *H01L 29/401* (2013.01); *H01L 21/67144* (2013.01); *H01L 21/67259* (2013.01)

(58) Field of Classification Search
CPC ... H01J 27/023; H01J 27/32082; H01L 21/67; H01L 29/401; H01L 21/67144;

(Continued)

(56) References Cited

U.S. PATENT DOCUMENTS

| 4,763,827 A * | 8/1988 | Watanabe | ......... H01L 21/67259 228/6.2 |
| 2004/0084146 A1* | 5/2004 | Sekiya | .............. H01J 37/32495 156/345.24 |

(Continued)

FOREIGN PATENT DOCUMENTS

| CN | 101206232 A | 6/2008 |
| CN | 101373703 A | 2/2009 |

(Continued)

OTHER PUBLICATIONS

International Search Report cited in PCT/CN2021/110056, mailed Mar. 29, 2022, 10 pages.

*Primary Examiner* — Galina G Yushina
(74) *Attorney, Agent, or Firm* — Syncoda LLC; Feng Ma

(57) ABSTRACT

The embodiment of the present application discloses a mounting apparatus and a mounting method. The mounting apparatus comprises: a bracket; a tray movably disposed on the bracket, wherein the tray comprises the first bearing portion and the second bearing portion, the second bearing portion is disposed around the circumference of the first bearing portion and coincides with the center of gravity of the first bearing portion, a first sensor, which is disposed at the center of gravity of the first bearing portion and collects the offset of the center of gravity of the supported first upper electrode portion and the second upper electrode portion; and a driving assembly, which is connected to the tray, drives the tray to ascend and descend and drives the tray to adjust the supporting positions of the first upper electrode portion and the second upper electrode portion.

14 Claims, 5 Drawing Sheets

(58) Field of Classification Search
CPC ......... H01L 21/67259; H01L 21/67121; B23P 19/00; B25B 11/00; H05K 3/068; G03F 9/7096; G01F 23/242
See application file for complete search history.

(56) References Cited

U.S. PATENT DOCUMENTS

| | | | | |
|---|---|---|---|---|
| 2010/0008013 | A1* | 1/2010 | Lu | H01L 21/6833 361/234 |
| 2018/0240650 | A1* | 8/2018 | Matsuura | H01J 37/32091 |

FOREIGN PATENT DOCUMENTS

| | | | |
|---|---|---|---|
| CN | 203553121 U | 4/2014 | |
| CN | 104482951 A | 4/2015 | |
| CN | 206976283 U | 2/2018 | |
| CN | 108022820 A | 5/2018 | |
| CN | 207495342 U | 6/2018 | |
| CN | 109244024 A | 1/2019 | |
| CN | 209571401 U | 11/2019 | |
| CN | 212113618 U | 12/2020 | |
| CN | 212542350 U | 2/2021 | |
| JP | 2004088051 A | 3/2004 | |

\* cited by examiner

MOUNTING APPARATUS AND MOUNTING METHOD

CROSS-REFERENCE TO RELATED APPLICATIONS

This application is a continuation application of International Patent Application No. PCT/CN2021/110056, filed on Aug. 2, 2021, which claims priority to Chinese Patent Application No. 202110806169.6, filed with the Chinese Patent Office on Jul. 16, 2021 and entitled "Mounting Apparatus and Mounting Method". International Patent Application No. PCT/CN2021/110056 and Chinese Patent Application No. 202110806169.6 are incorporated herein by reference in their entireties.

TECHNICAL FIELD

The application relates to the technical field of semiconductor processing, and in particular to a mounting apparatus and a mounting method.

BACKGROUND

A semiconductor device, such as an etching device, is an essential device for implementing semiconductor manufacturing process, microelectronic IC manufacturing process and micro-nano manufacturing process, and an etching process is a major process of pattern processing associated with lithography. The upper and lower electrodes are disposed in the etching cavity of an etching device, and the mounting of the upper electrode is the key to ensuring the stability of an etching process.

At present, the mounting of the upper electrode of a semiconductor device generally needs to be carried out manually. The human mounting techniques in the mounting process will not only affect the success rate of cleaning and maintenance and the service life of a semiconductor device, but will also lead to the uneven distribution of temperature field and ionization in the chamber of a semiconductor device, resulting in a product yield problem.

SUMMARY

The following is an overview of the subject described in detail in the present application. The summary is not intended to limit the scope of protection of the claims.

A first aspect of the embodiments of the present application provides a mounting apparatus, comprising: a bracket; a tray movably disposed on the bracket, wherein the tray comprises a first bearing portion and a second bearing portion, the first bearing portion is used for supporting the first upper electrode portion of a semiconductor device connected to the mounting apparatus, the second bearing portion is disposed around the circumference of the first bearing portion and used for supporting a second upper electrode portion of the semiconductor device, wherein the second bearing portion has a gravity center that coincides with a center of gravity of the first bearing portion; a first sensor, which is disposed at the center of gravity of the first bearing portion and collects the offsets of the center of gravity of the supported first upper electrode portion and the second upper electrode portion; a driving assembly, which is connected to the tray, drives the tray to ascend and descend, and drives the tray to adjust the supporting positions of the first upper electrode portion and the second upper electrode portion according to the offsets of the center of gravity collected by the first sensor.

A second aspect of the embodiments provides a mounting method, comprising the following steps: providing the mounting apparatus as described above; supporting the first upper electrode portion on the first bearing portion and supporting the second upper electrode portion on the second bearing portion; mounting the mounting apparatus into the semiconductor device by the bracket; collecting the offsets of the center of gravity of the first upper electrode portion and/or the second upper electrode portion on the tray with the first sensor; driving the tray to adjust the supporting positions of the first upper electrode portion and the second upper electrode portion with the driving assembly; lifting and lowering the tray by the driving assembly to drive the first upper electrode portion and the second upper electrode portion to the mounting positions; mounting the first upper electrode portion and the second upper electrode portion; and disassembling the mounting apparatus after the first upper electrode portion and the second upper electrode portion are mounted to the semiconductor device and then the semiconductor device is started to perform an etching process.

REFERENCE NUMERALS

Figure 1:
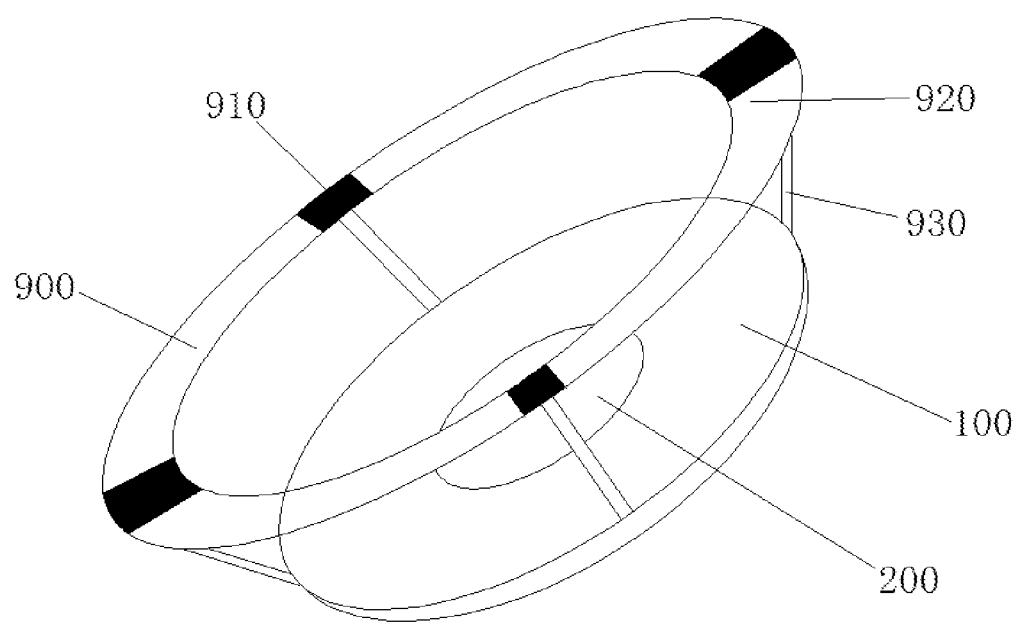
FIG. 1 is a schematic structure diagram of the mounting apparatus according to an embodiment of the present application.

100: a tray; 110: a first bearing portion; 120: a second bearing portion; 200: a first sensor; 300: a driving assembly; 400: a first control unit; 500: a second control unit; 600: a metering portion; 700: an amplifier; 800: an analog-to-digital converter; 900: a bracket; 910: a screw lock; 920: a ring; 930: a support rods; 1000: a semiconductor device; 1001: a chamber; 1100: an upper electrode structure; 1010: a first upper electrode portion; 1020: a second upper electrode portion; 210*a*: an upper limiter: 210*b*: a lower limiter; 220: a second sensor; 230: a third sensor; 940*a*: a first mounting hole; 940*b*: a first fastener; 950*a*: a second mounting hole; 950*b*: a second fastener.

DESCRIPTION OF EMBODIMENTS

In order to make the object, technical scheme and advantages clearer, the present application is further described in detail, combined with specific method and referring to the appended drawings. It should be understood that these descriptions are exemplary only and are not intended to limit the scope of the present application. In addition, in the following notes, the description of known structures and techniques is omitted to avoid unnecessarily confusion of the concepts of the present application.

A schematic diagram of a layer structure according to an embodiment of the present application is shown in the appended drawings. These drawings are not drawn to scale, wherein some details are enlarged or may be omitted for clarity. The shapes of the various regions and layers and the relative sizes and positional relationships therebetween shown in the figure are only exemplary. In practice, there may be some deviations due to manufacturing tolerances or technical limitations, and those skilled in the art may design another region/layer with different shapes, sizes and relative positions according to actual needs.

It is apparent that the described embodiments are part of and not all of the embodiments of the present application. Based on the embodiments in the present application, all other embodiments obtained by those of ordinary skill in the art without making creative efforts fall within the scope of the present application for protection.

In addition, the technical features described below in various embodiments of the present application may be combined with each other as long as they do not conflict with each other.

The present application will be described in more detail below with reference to the appended drawings. Throughout the various figures, the same elements are denoted by the similar reference numeral. For the sake of clarity, various parts in the appended drawings are not drawn to scale.

FIG. 1 is a schematic structure diagram of the mounting apparatus according to an embodiment of the present application.

Figure 2:
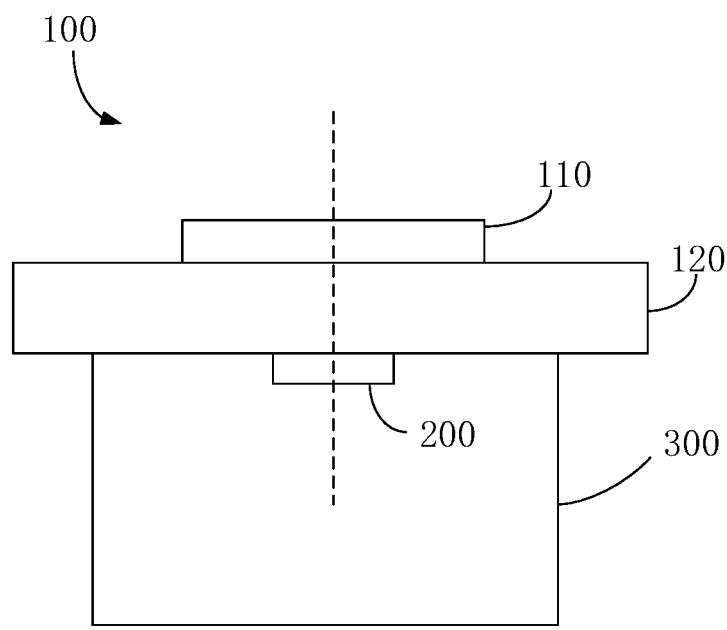
FIG. 2 is a side structure diagram of the tray according to an embodiment of the present application.
Figure 3:
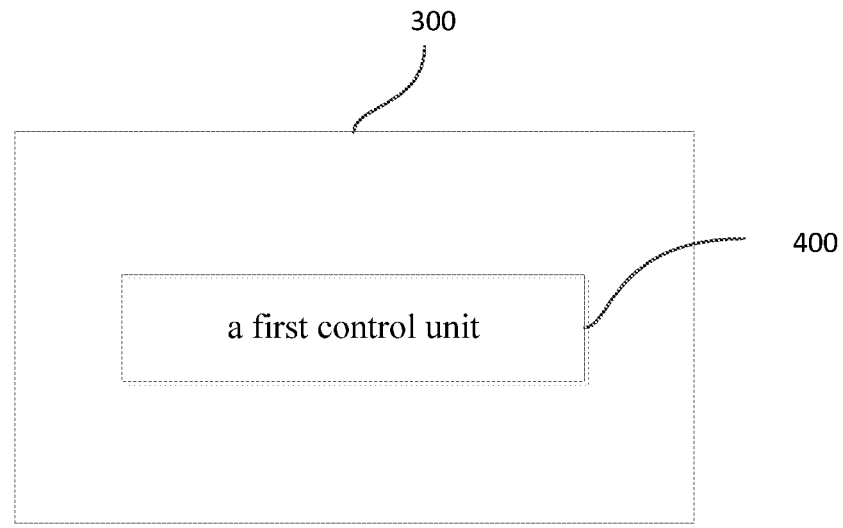
FIG. 3 is a schematic block diagram of the metering portion according to an embodiment of the present application.

FIG. 2 is a side structure diagram of the tray according to an embodiment of the present application.

Figure 7:
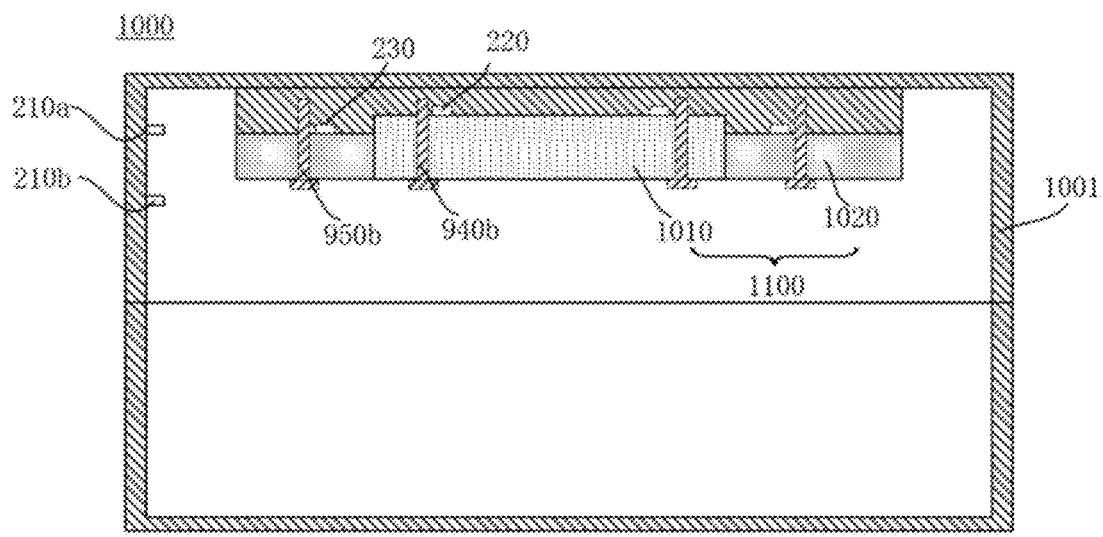
FIG. 7 is a schematic structure diagram of a semiconductor device according to an embodiment of the present application.

Referring to FIGS. 1, 2 and 7, an embodiment of the present application provides a mounting apparatus which comprises a bracket 900 and a tray 100, movably disposed on the bracket 900, wherein the tray 100 comprises a first bearing portion 110 and a second bearing portion 120, the first bearing portion 110 is used for supporting the first upper electrode portion of the semiconductor device 1000, the second bearing portion 120 is disposed around the circumference of the first bearing portion 110 and the second bearing portion 120 is used for supporting the second upper electrode portion of the semiconductor device 1000 wherein, the second bearing portion 120 has a gravity center that coincides with a center of gravity of the first bearing portion 110; a first sensor 200, which is disposed at the center of gravity of the first bearing portion 110 and collects the offsets of the center of gravity of the supported first upper electrode portion 1010 and the second upper electrode portion 1020; a driving assembly 300, which is connected to the tray 100, drives the tray 100 to ascend and descend, and drives the tray 100 to adjust the supporting positions of the first upper electrode portion 1010 and the second upper electrode portion according to the offsets of the center of gravity collected by the first sensor 200.

The mounting apparatus and the mounting method provided in embodiments of the present application, the driving assembly drives the tray to move automatically, comprising automatic horizontal movement, ascending and descending, thereby accurately driving the first upper electrode portion 1010 and the second upper electrode portion of the semiconductor device 1000 supported on the tray to the mounting position to carry out the mounting operations and calibrating the accuracy with the second sensor 220 and/or the third sensor 230, which will effectively avoid the unexpected operation error, reduce the working load of the personnel, save the cost and improve the success rate of cleaning and maintenance of the semiconductor device 1000. Accordingly, the operating time of the semiconductor device 1000 is prolonged, the service life is guaranteed, and the manufacturing process based on the semiconductor device 1000 is performed stably. In addition, the tray of the mounting apparatus in the embodiment of the present application can also measure the weight of the first upper electrode portion 1010 and/or the second upper electrode portion with the metering portion to judge the service life thereof, thereby avoiding the breakdown of the semiconductor device 1000 caused by the mounting of elements out of service life.

Still referring to FIG. 1, in an alternative embodiment, the bracket 900 of the mounting apparatus is connected with the tray 100, for example, movably connected to the edge of the second support part 102 of the tray 100, and the screw lock 910 may be set on the bracket 900, for example, on its end face, so that the mounting apparatus is fastened to the semiconductor device 1000 by the screw lock 910 to perform an mounting operation, and the mounting apparatus is disassembled by loosening the screw lock 910 after the mounting operation is completed. Then the semiconductor device 1000 is started to perform the etching process.

Still referring to FIG. 1, in an alternative embodiment, the bracket 900 comprises a ring 920, and the orthographic projection of the tray 100 is disposed in the central region of the plane where the ring 920 is disposed, so that the tray 100 can move freely within the ring 920 without obstacles, the tray 100 may be movably connected to the bracket 900 by at least two support rods 930, such as 2, 4 or 6 support rods without particular limitation, which may be uniformly fixed along the tray 100, such as the outer edge of the second support part 102, and the support rods 930 moves relative to the bracket 900 as the tray 100 moves.

Figure 6:
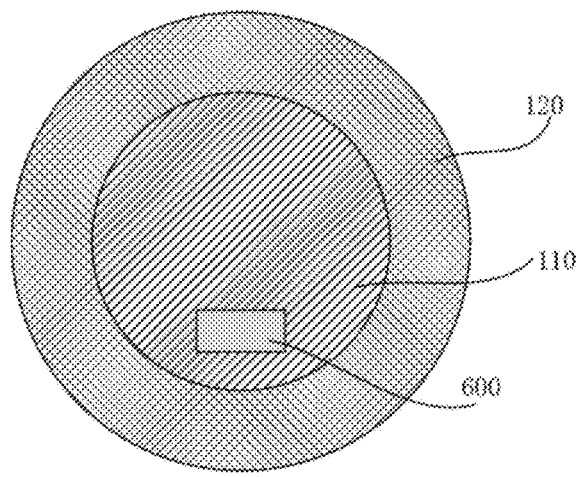
FIG. 6 is a top structure diagram of the tray according to an embodiment of the present application.

Still referring to FIGS. 1, 2 and 6, the tray 100 is movably disposed on the bracket 900, the first bearing portion 110 of the tray 100 is used for supporting the first upper electrode portion 1010 of the semiconductor device 1000, and a second bearing portion 120 is used for supporting the second upper electrode portion (not shown in the figure) of the semiconductor device 1000, wherein the first upper electrode portion 1010 and the second upper electrode portion constitute an upper electrode structure 1100 of the semiconductor device 1000 which is mounted in a chamber 1001 of the semiconductor device 1000 is used for controlling the distribution of plasma in the chamber 1001 of the semiconductor device 1000 and controlling the semiconductor process, such as a dry etching process. The second bearing portion 120 is disposed around the circumference of the first bearing portion 110 in the present application embodiment, and the second bearing portion 120 has a gravity center that coincides with a center of gravity of the first bearing portion 110, for example, the surface of the first bearing portion 110 protrudes from the surface of the second bearing portion 120, so that the first upper electrode portion 1010 and the second upper electrode portion 1020 are simultaneously supported on the surface of the tray 100 with excellent mounting accuracy and can be assembled simultaneously or separately to ensure the mounting efficiency and the mounting matching degree. The tray 100 structure provided by the embodiment of the present application effectively ensures the stability of the semiconductor process, ensures the critical dimension of the substrate (not shown in the figure), for example wafer, and further ensures the production yield.

Still referring to FIG. 2, in an alternative embodiment, the first bearing portion 110 is a circular disk and the second bearing portion 120 is an annular disk, wherein the circular disk and the annular disk have the same center of circle which coincides with the center of gravity.

Still referring to FIGS. 1 and 2, the first sensor 200 is disposed at the center of gravity of the first bearing portion 110 and is connected to the first control unit 400 of the driving assembly 300. The second bearing portion 120 has a gravity center that coincides with a center of gravity of the first bearing portion 110, that is, the second bearing portion 120 has a center of gravity disposed in the same position where a center of gravity of the first bearing portion 110 is disposed, therefore the first sensor 200 disposed at the center of gravity of the first bearing portion 110 can collect the offsets of the center of gravity of the first upper electrode portion 1010 and the second upper electrode portion 1020 both supported by the first sensor 200. Specifically, the first sensor 200 collects offset of gravity center of the first upper electrode portion 1010 of semiconductor device 1000 from the gravity center of the first bearing portion 110. The first sensor 200 collects offset of gravity center of the second upper electrode portion 1020 of semiconductor device 1000 from the gravity center of the second bearing portion 120, that is, the gravity center of the first bearing portion 110. Then the driving assembly 300 controls the tray 100 to carry out horizontal adjustment, driving the first upper electrode portion 1010 and/or the second upper electrode portion 1020 to move and adjust the center of gravity and keeping the levelness and being in the center position.

Still referring to FIG. 2, in an alternative embodiment, the first sensor 200 may comprise a displacement sensor and, of course, may also comprise a gravity sensor and any other sensor structure capable of collecting the offsets of the center of gravity, without particular limitation.

Still referring to FIGS. 1 to 3, and 7, in some alternative embodiments, the driving assembly 300 provided by the embodiment of the present application comprises, for example: a driving motor (not shown in the figure) connected to the tray 100; a first control unit 400, which is communicatively connected with the driving motor and the first sensor 200, and controls the driving motor to drive the tray 100 to move; and a plurality of limiters 210a, 210b which are respectively disposed on the semiconductor device 1000, for example, to limit the lifting range of the tray 100 wherein the driving motor drives the tray 100 to ascend and descend within the lifting range, for example, to automatically ascend and descend. Of course, the plurality of limiters 210a, 210b can also be disposed on the bracket 900 to define the lifting range of the tray 100.

The mounting apparatus in the embodiment of the present application controls the driving motor to drive the tray 100 to ascend or descend by the first control unit 400, changes the mounting apparatus from manual ascending and descending to automatically ascending and descending, and drives the tray 100 to drive the displacement of the upper electrode structure 1100 to adjust the center of gravity through the cooperation of the first sensor 200 and the driving assembly 300. The embodiment of the application improves the success rate of the mounting and cleaning of the semiconductor device 1000, and ensures the working time of the semiconductor device 1000.

In an alternative embodiment, the driving motor may be a servo motor, and the first control unit 400, for example a programmable logic controller (PLC), is used for controlling the operation of the driving motor.

In an alternative embodiment, a plurality of limiters 210a, 210b may, for example, be a plurality of position sensors, comprising, for example, two position sensors disposed opposite to each other vertically. The distance between the upper and lower position sensors defines the lifting range, and the tray 100 moves within the lifting range to ensure that the upper electrode structure 1100 reaches the mounting position.

The tray 100 of the mounting apparatus of the present application can be kept level with the upper electrode structure 1100 and the height can be adjusted by the driving assembly 300 to make the operation more accurate. The damage of products is reduced, which can not only reduce the workload of the personnel, but also save costs.

Figure 4:
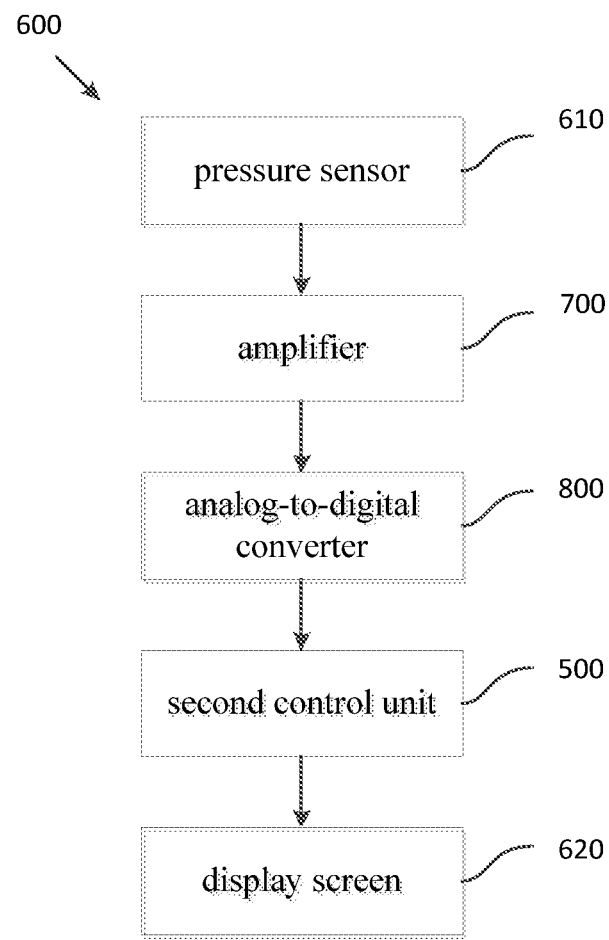
FIG. 4 is a schematic block diagram of the driving assembly according to an embodiment of the present application.

Still referring to FIGS. 1, 4 and 6, in an alternative embodiment, the tray 100 of the mounting apparatus may further comprise a metering portion 600, which may be disposed on the surface of the tray 100, for example, on the second bearing portion 120, and weighs and displays the weights of the first upper electrode portion 1010 and the second upper electrode portion 1020. The metering portion 600 can detect the weight of the upper electrode structure 1100 in real time, and replace the upper electrode structure 1010 in time when the weight of the upper electrode structure 1100 is found insufficient at the first time, thereby avoiding mounting an upper electrode structure 1100 out of service life, which in turn affects the semiconductor manufacturing process.

Still referring to FIG. 4 and FIG. 6, in an alternative embodiment, the metering portion 600 comprises a pressure sensor 610 and a display screen 620 connected to the pressure sensor 610 for displaying the weight of the upper electrode structure 1100 it collects.

Still referring to FIG. 4, in an alternative embodiment, the metering portion 600 may also comprise an amplifier 700 disposed between the pressure sensor 610 and the display screen 620 for amplifying the data acquired by the pressure sensor 610.

Still referring to FIG. 4, in an alternative embodiment, the metering portion 600 may further comprise an analog-to-digital converter 800 disposed between the amplifier 700 and the display screen 620 of the metering portion 600 for converting analog signals acquired by the pressure sensor 610 into digital signals.

Still referring to FIG. 4, when an object is placed on the pressure sensor 610, pressure is applied to the pressure sensor 610, and the pressure sensor 610 is elastically deformed, thereby changing the impedance, and at the same time, the excitation voltage to output a changed analog signal. The signal is amplified by the amplifier 700 and output to the analog-to-digital converter 800. The converted digital signal is output to a second control unit 500 for operation control, for example, a central processing unit.

The mounting apparatus in the embodiment of the present application further comprises: at least one second sensor 220, which is disposed on the semiconductor device 1000 and is close to the mounting position of the first upper electrode portion 1010 for calibrating the mounting position of the first upper electrode portion 1010; And/or, at least one third sensor 230, which disposed on the semiconductor device 1000 and may be disposed below the second sensor 220, wherein the third sensor 230 is close to the mounting position of the second upper electrode portion 1020 for calibrating the mounting position of the second upper electrode portion 1020.

Figure 8:
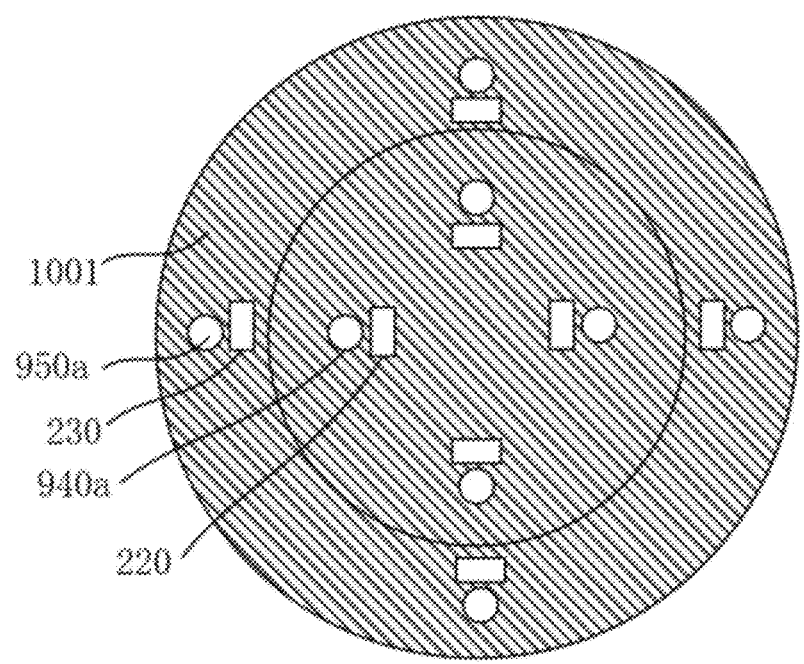
FIG. 8 is a bottom structure diagram of the semiconductor device chamber according to an embodiment of the present application.

Referring to FIGS. 7 and 8, in an alternative embodiment, the semiconductor device 1000 is provided with a first mounting hole 940a and a second mounting hole 950a, the first upper electrode portion 1010 having the first fastener 940b matched with the first mounting hole 940a and the second upper electrode portion 1020 having the second fastener 950b matched with the second mounting hole 950a, wherein the second sensor 220 is disposed at one side of the first mounting hole 940a, for example the right side, with a good shielding effect, and the second sensor 220 has a preset distance from the first mounting hole 940a. And the third sensor 230 may be the same as the second sensor 220, for example, disposed on the right side of the second mounting hole 950a, with a preset distance between the third sensor 230 and the second mounting hole 950a, and the preset distance is, for example, 2 to 10 mm, for example, 2 mm, 3 mm or 5 mm.

Still referring to FIGS. 7 and 8, in an alternative embodiment, there are a plurality of the second sensor 220 and the third sensors 230 corresponding to the mounting positions, for example, 2, 3 or 4, etc.

In an alternative embodiment, the second sensor 220 and the third sensor 230 are photoelectric sensors.

Figure 5:
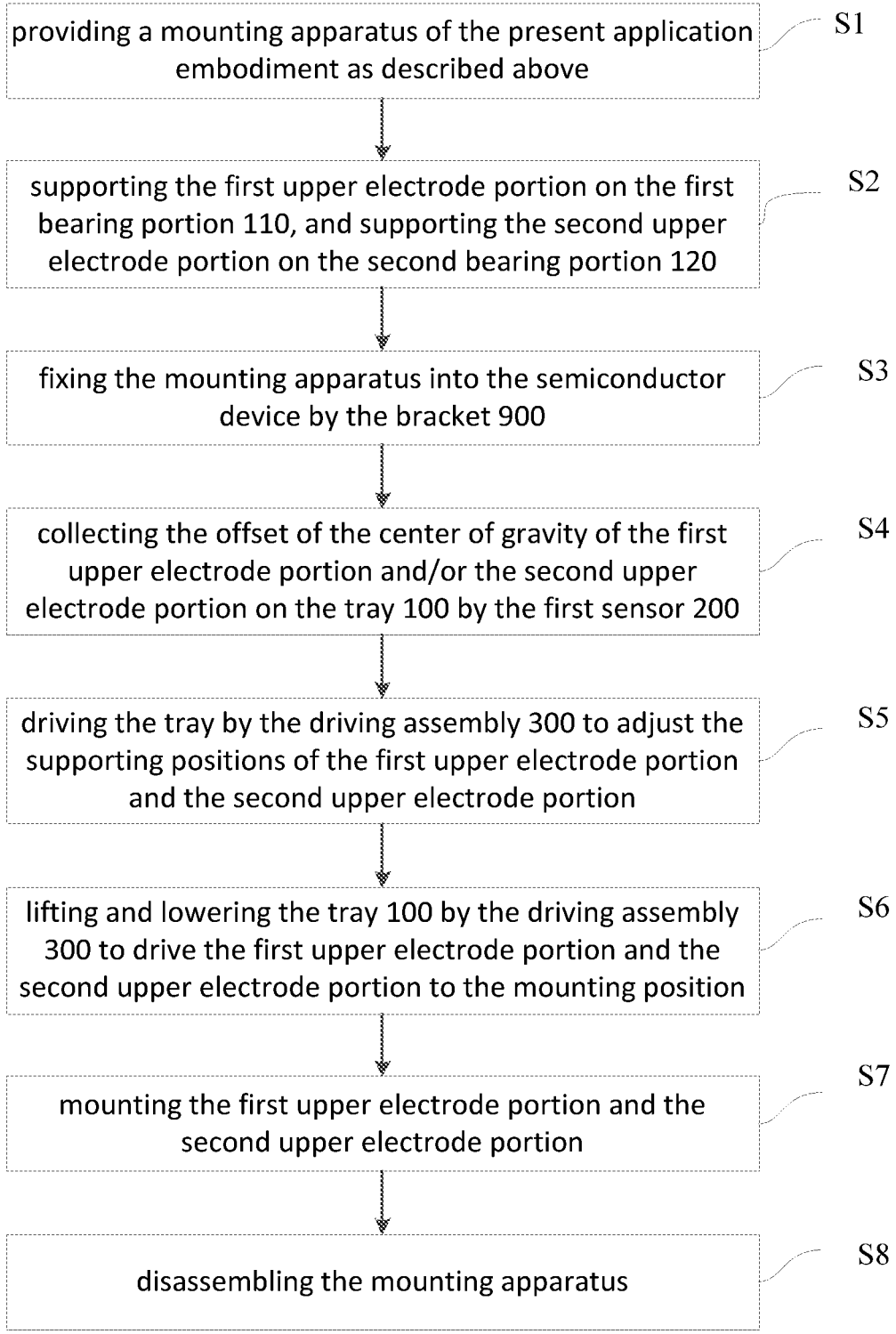
FIG. 5 is a flowchart of the mounting method according to an embodiment of the present application.

Referring to FIG. 5, the embodiment of the present application also provides a mounting method, comprising:

S1, providing a mounting apparatus of the present application embodiment as described above.

S2, supporting the first upper electrode portion 1010 on the first bearing portion 110, and supporting the second upper electrode portion 1020 on the second bearing portion 120.

S3, fixing the mounting apparatus into the semiconductor device 1000 by the bracket 900.

S4, collecting the offsets of the center of gravity of the first upper electrode portion 1010 and/or the second upper electrode portion 1020 on the tray 100 by the first sensor 200.

S5, driving the tray by the driving assembly 300 to adjust the supporting positions of the first upper electrode portion 1010 and the second upper electrode portion 1020.

S6, lifting and lowering the tray 100 by the driving assembly 300 to drive the first upper electrode portion 1010 and the second upper electrode portion 1020 to the mounting position.

S7, mounting the first upper electrode portion 1010 and the second upper electrode portion 1020.

S8, disassembling the mounting apparatus.

The first upper electrode portion 1010 is supported on the first bearing portion 110, and the second upper electrode portion 1020 is supported on the second bearing portion 120, wherein the first upper electrode portion 1010 and the second upper electrode portion 1020 constitute an upper electrode structure 1100 of the semiconductor device 1000.

In an alternative embodiment, the mounting apparatus is fixed in the semiconductor device 1000, for example in a chamber 1001 of the semiconductor device 1000. In an alternative embodiment, the first upper electrode portion 1010 and the second upper electrode portion 1020 are mounted, for example, with automatic locking or manual locking.

In an alternative embodiment, before the first sensor 200 measures the offsets of the center of gravity, or even before the mounting apparatus is fixed in the semiconductor device 1000, the weight data of the first upper electrode portion 1010 and/or the second upper electrode portion 1020 is collected by the pressure sensor 610 of the metering portion 600, and the weight data will be delivered to the second control unit 500.

In an alternative embodiment, the second control unit 500 displays the weight data on the display screen 620 of the metering portion 600.

In an alternative embodiment, delivering the weight data to the second control unit 500 may comprise amplifying the weight data with the amplifier 700.

In an alternative embodiment, the analog-to-digital converter 800 converts the amplified weight data into a digital signal and delivers it to the second control unit 500.

In an alternative embodiment, fixing the mounting apparatus in the semiconductor chamber 1001 may comprise: measuring the mounting positions of the first upper electrode portion 1010 and the second upper electrode portion 1020 with the semiconductor chamber 1001 by the second sensor 220 and/or the third sensor 230, and even adjusting the mounting positions by the third control unit (not shown in the figure).

In an alternative embodiment, the information of the mounting position of the first upper electrode portion 1010 and/or the second upper electrode portion 1020 is respectively collected by the second sensor 220 and the third sensor 230 to calibrate whether the mounting position is in a predetermined mounting position, that is, to determine whether the first upper electrode portion 1010 and/or the second upper electrode portion 1020 are accurately mounted in the chamber 1001 of the semiconductor device 1000, for example, to determine whether the first fastener 940b on the first upper electrode portion 1010 is locked to the first mounting hole 940a in the chamber 1001 of the semiconductor device 1000 and whether the second fastener 950b on the second upper electrode portion 1020 is locked to the second mounting hole 950a in the chamber 1001 of the semiconductor device 1000.

If yes, the second sensor 220 and/or the third sensor 230 are normal, the mounting operation is completed, and then the mounting apparatus is disassembled.

If not, the second sensor 220 and/or the third sensor 230 emits an alarm.

The present application is intended to protect a mounting apparatus and a mounting method. The mounting apparatus comprises: a bracket 900 and a tray 100, movably disposed on the bracket 900, wherein the tray 100 comprises a first bearing portion 110 and a second bearing portion 120, the first bearing portion 110 is used for supporting the first upper electrode portion 1010 of the semiconductor device 1000, the second bearing portion 120 is disposed around the circumference of the first bearing portion 110 and the second bearing portion 120 is used for supporting the second upper electrode portion 1020 of the semiconductor device 1000 wherein, the second bearing portion 120 has a gravity center that coincides with a center of gravity of the first bearing portion 110; a first sensor 200, which is disposed at the center of gravity of the first bearing portion 110 and collects the offsets of the center of gravity of the supported first upper electrode portion 1010 and the second upper electrode portion 1020; a driving assembly 300, which is connected to the tray 100, drives the tray 100 to ascend and descend, and drives the tray 100 to adjust the supporting positions of the first upper electrode portion 1010 and the second upper electrode portion 1020 according to the offsets of the center of gravity collected by the first sensor 200.

It should be understood that the above-described embodiments of the present application are only intended to be illustrative or to explain the principles of the present application and are not intended to limit the present application. Therefore, any modification, equivalent replacement, improvement, etc. which is made without departing from the spirit and scope of the application, shall be comprised in the scope of protection of the application. In addition, the appended claims of the present application are intended to cover all such variations and modifications which fall within the scope and boundary of the appended claims or equivalent forms of such scope and boundary.

What is claimed is:

1. A mounting apparatus, comprising:
a bracket:
a tray movably disposed on the bracket, wherein the tray comprises a first bearing portion and a second bearing portion,
the first bearing portion being used for supporting a first upper electrode portion of a semiconductor device connected to the mounting apparatus,
the second bearing portion being disposed around a circumference of the first bearing portion and having a gravity center that coincides with a center of gravity of the first bearing portion, the second bearing portion being used for supporting a second upper electrode portion of the semiconductor device;
a first sensor, being disposed at the center of gravity of the first bearing portion, wherein, the first sensor collects an offset of the center of gravity of the supported first upper electrode portion from the center of gravity of the first bearing portion and collects an offset of the center of gravity of the supported second upper electrode portion from the center of gravity of the first bearing portion; and
a driving assembly, which is connected to the tray, drives the tray to ascend and descend, and drives the tray to adjust supporting positions of the first upper electrode portion and the second upper electrode portion according to the corresponding offsets of the center of gravity collected by the first sensor.

2. The mounting apparatus of claim 1, wherein
the tray further comprises a metering portion which weighs and displays weights of the first upper electrode portion and the second upper electrode portion.

3. The mounting apparatus of claim 1, wherein
the driving assembly comprises:
a driving motor connected to the tray;
a first control unit, which is communicatively connected the driving motor and the first sensor, and controls the driving motor to drive the tray to move; and
a plurality of limiters which are respectively disposed on the semiconductor device to limit a lifting range of the tray, wherein the driving motor drives the tray to ascend and descend within the lifting range.

4. The mounting apparatus of claim 1, wherein
the first sensor comprises a displacement sensor.

5. The mounting apparatus of claim 1, wherein
the mounting apparatus further comprises at least one of:
at least one second sensor, which is disposed on the semiconductor device and is adjacent to a mounting position of the first upper electrode portion to calibrate the mounting position of the first upper electrode portion; or
at least one third sensor, which is disposed below the second sensor and is adjacent to a mounting position of the second upper electrode portion to calibrate the mounting position of the second upper electrode portion.

6. The mounting apparatus of claim 5, wherein
the semiconductor device is provided with a first mounting hole and a second mounting hole, the first upper electrode portion having a first fastener matched with the first mounting hole and the second upper electrode portion having a second fastener matched with the second mounting hole, wherein,
the at least one second sensor is disposed at one side of the first mounting hole and has a preset distance from the first mounting hole.

7. The mounting apparatus of claim 6, wherein
the preset distance is 2 mm 10 mm.

8. The mounting apparatus of claim 5, wherein
the at least one second sensor is one of a plurality of second sensors corresponding to the mounting positions;
and the at least one third sensor is one of a plurality of third sensors corresponding to the mounting positions.

9. The mounting apparatus of claim 5, wherein
the at least one second sensor and the at least one third sensor are photoelectric sensors.

10. The mounting apparatus of claim 1, wherein
the bracket has a ring shape, and an orthographic projection of the tray is disposed in an orthographic projection of the bracket.

11. The mounting apparatus of claim 10, wherein
the tray is movably connected to the bracket by at least two support rods.

12. The mounting apparatus of claim 10, wherein
a surface of the first bearing portion protrudes from a surface of the second bearing portion, wherein the first bearing portion is a circular disk and the second bearing portion is an annular disk, both circular disks the same center which coincides with the center of gravity.

13. The mounting apparatus of claim 1, wherein
the bracket is provided with a screw lock for fixing the mounting apparatus to the semiconductor device.

14. A mounting method, comprising:
providing the mounting apparatus of claim 1;
supporting the first upper electrode portion on the first bearing portion and supporting the second upper electrode portion on the second bearing portion;
fixing the mounting apparatus into the semiconductor device by the bracket;
collecting the offsets of the center of gravity of at least one of the first upper electrode portion or the second upper electrode portion on the tray by the first sensor;
driving the tray by the driving assembly to adjust the supporting positions of at least one of the first upper electrode portion and the second upper electrode portion;
lifting and lowering the tray by the driving assembly to drive the first upper electrode portion and the second upper electrode portion to a mounting position;
mounting the first upper electrode portion and the second upper electrode portion; and
dismounting the mounting apparatus before operation of the semiconductor.

* * * * *